United States Patent
Babitch et al.

(10) Patent No.: US 9,644,971 B2
(45) Date of Patent: May 9, 2017

(54) MEMS RECORDER APPARATUS METHOD AND SYSTEM

(71) Applicant: Samsung Electronics Co., Ltd., Gyeonggi-do (KR)

(72) Inventors: Daniel Babitch, San Jose, CA (US); Nicolas Vantalon, Carros (FR)

(73) Assignee: Samsung Electronics Co., Ltd (KR)

( * ) Notice: Subject to any disclaimer, the term of this patent is extended or adjusted under 35 U.S.C. 154(b) by 367 days.

(21) Appl. No.: 14/532,582

(22) Filed: Nov. 4, 2014

(65) Prior Publication Data

US 2017/0024345 A1    Jan. 26, 2017

Related U.S. Application Data

(60) Provisional application No. 61/899,573, filed on Nov. 4, 2013.

(51) Int. Cl.
| | |
|---|---|
| *G01C 21/16* | (2006.01) |
| *G06F 13/40* | (2006.01) |
| *G06F 13/42* | (2006.01) |
| *G06F 1/32* | (2006.01) |

(Continued)

(52) U.S. Cl.
CPC ............ *G01C 21/165* (2013.01); *G01S 19/26* (2013.01); *G01S 19/47* (2013.01); *G06F 1/3243* (2013.01); *G06F 13/4022* (2013.01); *G06F 13/4282* (2013.01); *B81B 2201/0235* (2013.01); *B81B 2201/0242* (2013.01)

(58) Field of Classification Search
None
See application file for complete search history.

(56) References Cited

U.S. PATENT DOCUMENTS

| | | |
|---|---|---|
| 5,592,173 A | 1/1997 | Lau et al. |
| 5,864,315 A | 1/1999 | Welles et al. |
| 6,662,107 B2 | 12/2003 | Gronemeyer |

(Continued)

FOREIGN PATENT DOCUMENTS

WO    WO 2012073127    6/2012

OTHER PUBLICATIONS

Sony Commercializes Industry Lowest 10mW Power Consumption;Global Navigation Satellite System (GNSS) Receiver LSIs for Smartphones & Mobile Products,EPN Newswire,Feb. 22, 2013, pp. 1-7.

(Continued)

*Primary Examiner* — Russell Frejd
(74) *Attorney, Agent, or Firm* — The Farrell Law Firm, P.C.

(57) ABSTRACT

A Micro-Electromechanical System (MEMS) recorder is provided. The MEMS recorder includes a scheduler, a serializer, a multiplexer, a transmit/receive switch, a master clock generator, a deserializer, a comparator array to determine whether to generate a signal to wake up a controller and/or a location module from a sleep mode, and a First-In-First-Out (FIFO) memory to output data to be stored and wake up the controller and/or the location module from the sleep mode if a signal to wake up the controller and/or the location module is received or if the FIFO memory is full, wherein the controller and/or the location module is awakened directly by the MEMS recorder or via the controller.

20 Claims, 7 Drawing Sheets

(51) Int. Cl.
*G01S 19/26* (2010.01)
*G01S 19/47* (2010.01)

(56) References Cited

U.S. PATENT DOCUMENTS

| | | |
|---|---|---|
| 7,249,730 B1 * | 7/2007 | Flippen, Jr. ............ F41G 7/346 |
| | | 244/3.1 |
| 7,847,726 B2 | 12/2010 | Jia et al. |
| 8,018,376 B2 | 9/2011 | McClure et al. |
| 8,072,379 B2 | 12/2011 | Gopinath |
| 8,106,821 B2 | 1/2012 | Farmer et al. |
| 8,185,083 B2 | 5/2012 | Babitch et al. |
| 8,362,949 B2 | 1/2013 | Yang et al. |
| 8,463,545 B2 | 6/2013 | Boore et al. |
| 8,489,111 B2 | 7/2013 | Chawla |
| 2008/0012759 A1 | 1/2008 | Te-Yi |
| 2009/0005986 A1 | 1/2009 | Soehren |
| 2010/0085203 A1 * | 4/2010 | Kahn ..................... G01P 13/00 |
| | | 340/669 |
| 2011/0071759 A1 | 3/2011 | Pande et al. |
| 2011/0309976 A1 | 12/2011 | Leclercq et al. |
| 2012/0116677 A1 | 5/2012 | Higgison et al. |
| 2012/0218146 A1 | 8/2012 | Leclercq |
| 2012/0223860 A1 | 9/2012 | Leclercq |
| 2013/0158860 A1 | 6/2013 | Gum |
| 2013/0166193 A1 | 6/2013 | Goldman et al. |

OTHER PUBLICATIONS

D. Torres, Using sensor controllers to reduce power consumption in mobile computing, TechOnline India; UBMTEC, Oct. 11, 2012, pp. 1-7.

X. Huang et al., Architecture and performance for MEMS-IMU aided GNSS tracking loops based on Fuzzy model, Computer Engineering and Technology (ICCET), 2010 2nd Int. Conf., vol. 4, pp. 441-445, Apr. 18, 2010.

* cited by examiner

MEMS RECORDER APPARATUS METHOD AND SYSTEM

PRIORITY

This application claims priority under 35 U.S.C. §119(e) to U.S. Provisional Patent Application No. 61/899,573 filed on Nov. 4, 2013, the entire contents of which are incorporated herein by reference.

BACKGROUND OF THE INVENTION

Field of the Invention

The present invention relates generally to a Micro-Electromechanical System (MEMS) recorder, and more particularly, to a portable device having controller, a location receiver, a MEMS recorder, and at least one MEMS sensor.

Description of the Related Art

Many portable devices are equipped with both a Global Navigation Satellite System (GNSS) receiver and one or more MEMS sensors, such as accelerometers, digital compasses, gyroscopes, inertial modules, and other functional sensors.

Most portable devices, such as handsets, are battery powered for at least some of their operational time. Optimum hardware design and loading reduces the average power usage of a portable device.

"Fusion navigation" is the combination of data from any of a long list of sensors and data from a GNSS receiver to help generate an always-available navigational output. However, the power loading of fusion navigation is unevenly distributed. Sometimes no workload is evident and other times very high workloads are evident. At a system design level, it is advantageous to design, partition, and size the hardware to optimize the total energy use of the resulting portable device.

Thus, there is a need for methods, systems, and apparatuses to optimize the resource usage of MEMS sensor systems in portable devices, and more particularly, in portable devices using fusion navigation.

SUMMARY OF THE INVENTION

The present invention has been made to address at least the above-identified problems and disadvantages, and to provide at least the advantages described below.

Accordingly, an aspect of the present invention provides a Micro-Electromechanical System (MEMS) recorder.

Another aspect of the present invention provides a portable device having a controller, a location module, a MEMS recorder, and at least one MEMS sensor.

In accordance with an aspect of the present invention, a MEMS recorder is provided. The MEMS recorder includes a scheduler configured to receive a recording schedule, bias values, comparator thresholds, and a device identification for at least one MEMS sensor; a serializer configured to serialize data received from the scheduler; a multiplexer configured to receive MEMS sensor data from at least one MEMS sensor, receive MEMS sensor data from another device, and receive an enable signal from the scheduler; a transmit/receive switch configured to receive MEMS sensor data from the multiplexer, receive serialized data from the serializer, and receive a signal from the scheduler indicating whether to receive or transmit; a master clock generator configured to generate a master clock signal for the MEMS recorder; a deserializer configured to receive a deserialize control signal from the scheduler, receive serialized MEMS sensor data from the transmit/receive switch, and deserialize the received serialized MEMS sensor data; a comparator array configured to receive a compare control signal from the scheduler, receive the bias values, receive deserialized MEMS sensor data from the deserializer, store the received deserialized MEMS sensor data as latest data, receive the device identification associated with the received deserialized MEMS sensor data, remove the bias values from the corresponding MEMS sensor data, compare the deserialized MEMS sensor data to the comparator threshold in accordance with the compare control signal to determine whether to generate a signal to wake up a controller and/or a location module if the controller and/or the location module are in sleep mode; and a First-In-First-Out (FIFO) memory configured to receive a FIFO control signal from the scheduler, receive the latest data from the comparator array, receive the result of the comparison from the comparator array, receive the signal to wake up the controller and/or the location module, if any, from the comparator array, and output data to be stored and wake up the controller and/or the location module, if the signal indicates that the controller and/or the location module should be awakened or the FIFO memory is full, wherein the controller and/or the location module is awakened directly by the MEMS recorder or via the controller.

In accordance with an aspect of the present invention, a MEMS recorder is provided. The MEMS recorder includes a scheduler configured to receive a recording schedule, filter parameters, bias values, comparator thresholds, and a device identification for at least one MEMS sensor; a serializer configured to serialize data received from the scheduler; a multiplexer configured to receive MEMS sensor data from at least one MEMS sensor, receive MEMS sensor data from another device, and receive an enable signal from the scheduler; a transmit/receive switch configured to receive MEMS sensor data from the multiplexer, receive serialized data from the serializer, and receive a signal from the scheduler indicating whether to receive or transmit; a master clock generator configured to generate a master clock signal for the MEMS recorder; a deserializer configured to receive a deserialize control signal from the scheduler, receive serialized MEMS sensor data from the transmit/receive switch, and deserialize the received serialized MEMS sensor data; a filter/comparator array configured to receive a filter/compare control signal from the scheduler, receive the bias values, receive deserialized MEMS sensor data from the deserializer, store the received deserialized MEMS sensor data as latest data, receive the device identification associated with the received deserialized MEMS sensor data, filter the received deserialized MEMS sensor data according to the filter/compare control signal, remove the bias values from the corresponding MEMS sensor data, compare the result of filtering to previous results of filtering to determine whether to generate a signal to wake up a controller and/or a location module if the controller and/or the location module are in sleep mode; and a First-In-First-Out (FIFO) memory configured to receive a FIFO control signal from the scheduler, receive the latest data from the filter/comparator array, receive the filtered MEMS sensor data from the filter/comparator array, receive the result of the comparison from the filter/comparator array, receive the signal to wake up the controller and/or the location module, if any, from the filter/comparator array, and output data to be stored and wake up the controller and/or the location module, if the signal indicates that the controller and/or the location module should be awakened or the FIFO memory is full, wherein the controller and/or the location module is awakened directly by the MEMS recorder or via the controller.

In accordance with another aspect of the present invention, a method of recording MEMS sensor data is provided. The method includes receiving, via a scheduler, a recording schedule, filter parameters, bias values, comparator thresholds, and a device identification for at least one MEMS sensor; serializing, via a serializer, data received from the scheduler; receiving, via a multiplexer, MEMS sensor data from at least one MEMS sensor, MEMS sensor data from another device, and an enable signal from the scheduler; receiving, via a transmit/receive switch, MEMS sensor data from the multiplexer, serialized data from the serializer, and a signal from the scheduler indicating whether to receive or transmit; generating, via a master clock generator, a master clock signal; receiving, via a deserializer, a deserialize control signal from the scheduler, serialized MEMS sensor data from the transmit/receive switch, and deserializing the received serialized MEMS sensor data; receiving, via a filter/comparator array, a filter/compare control signal from the scheduler, bias values from the scheduler, deserialized MEMS sensor data from the deserializer, and storing the received deserialized MEMS sensor data as latest data, receiving the device identification associated with the received deserialized MEMS sensor data, filtering the received deserialized MEMS sensor data according to the filter/compare control signal, removing the bias values from the corresponding MEMS sensor data, comparing the result of filtering to previous results of filtering to determine whether to generate a signal to wake up a controller and/or a location module if the controller and/or the location module is in sleep mode; and receiving, via a First-In-First-Out (FIFO) memory, a FIFO control signal from the scheduler, the latest data from the filter/comparator array, the filtered MEMS sensor data from the filter/comparator array, the result of the comparison from the filter/comparator array, the signal to wake up the controller and/or the location module, if any, from the filter/comparator array, and outputting data to be stored and waking up the controller and/or the location module, if the signal indicates that the controller and/or the location module should be awakened or the FIFO memory is full, wherein the controller and/or the location module is awakened directly by the MEMS recorder or via the controller.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EMBODIMENTS OF THE PRESENT INVENTION

Figure 1:
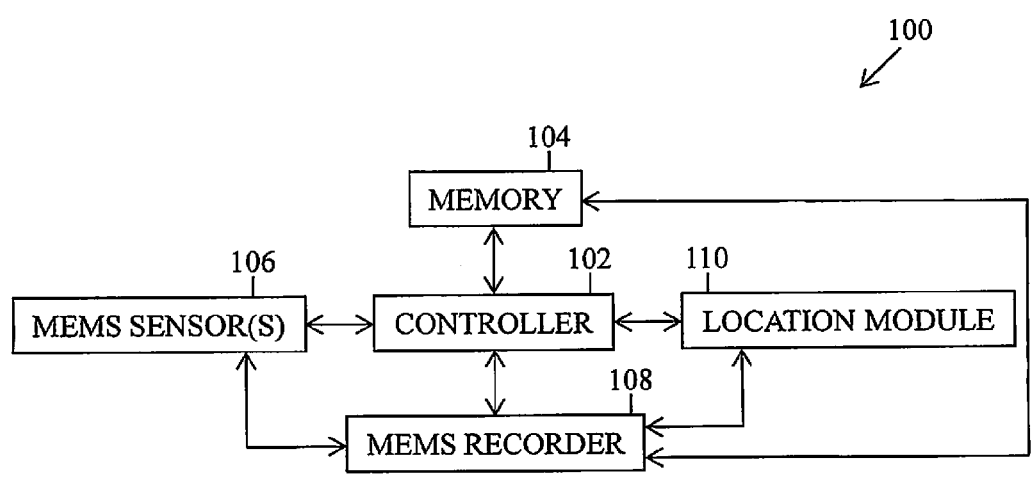
FIG. 1 is a block diagram of an electronic device according to an embodiment of the present invention.

Hereinafter, embodiments of the present invention are described with reference to the accompanying drawings. In the following description, the same or similar elements may be designated by the same reference numerals although they are shown in different drawings. Further, in the following description of the present invention, a detailed description of known functions and configurations incorporated herein are omitted when it would obfuscate the subject matter of the present invention.

Embodiments of the present invention include a method, apparatus, and system for using MEMS sensor information in an electronic device using fusion navigation (i.e., navigation based upon information provided from MEMS sensors and location information). In particular, embodiments of the present invention include a method and apparatus for selectively monitoring and recording MEMS information and determining whether to wake-up a location module in sleep mode based upon selectively monitored and recorded MEMS information. By relying upon information from MEMS sensors to determine whether to wake-up a location module in sleep mode, embodiments of the present invention may reduce power consumption and/or processing required by an electronic device implementing fusion navigation.

A configuration of an electronic device 100 for recording MEMS information according to an embodiment of the present invention is described as follows with reference to FIG. 1.

FIG. 1 is a block diagram of an electronic device 100 according to an embodiment of the present invention.

Referring to FIG. 1, the electronic device 100, according to an embodiment of the present invention, may be implemented as, for example, any of a portable communication terminal, a portable computer, a tablet computer, a cellular phone, a mobile phone, Personal Digital Assistant (PDA), etc. The electronic device 100 includes a controller 102, a memory 104, at least one MEMS sensor 106, a MEMS recorder 108, and a location module 110.

The controller 102 may include, for example, a single core Central Processing Unit (CPU), a multi-core CPU, multiple single core CPUs, multiple multi-core CPUs, or a combination thereof.

The controller 102 performs general control operations of the electronic device 100, and each of the memory 104, the at least one MEMS sensors 106, the MEMS recorder 108, and the location module 110 operate under control of the controller 102.

The controller 102 operates in any of a plurality of operational modes including a normal mode (i.e., an awake mode) and a sleep mode. During normal mode, the controller 102 performs general control operations of the electronic device 100. When the controller 102 is operating in sleep mode, it performs only a subset or none of the operations it performs during normal mode, or may alternatively perform the same operations in a manner that reduces an amount of processing and/or power consumption of the controller 102 and/or an amount of processing and/or power consumption of the electronic device 100 overall.

The controller 102 transitions from operating in normal mode to operating in sleep mode or transitions from operating in sleep mode to operating in normal mode in response to a control signal received from the MEMS recorder 108. For example, when the controller 102 is operating in sleep mode, the controller 102 may receive a wake-up signal from the MEMS recorder 108 instructing the controller 102 to transition from sleep mode to normal mode.

Typically, the memory 104 stores information provided from other elements of the electronic device 100, including, but not limited to, the controller 102 and the MEMS recorder 108. The memory 104 also provides stored information to other elements of the electronic device 100, including, but not limited to, the controller 102 and the MEMS recorder 108. The memory 104 may include volatile memory, nonvolatile memory, or both. Nonvolatile memory may include, for example, Read Only Memory (ROM), Programmable ROM (PROM), Electrically Programmable ROM (EPROM), Electrically Erasable PROM (EEPROM), or flash memory. Volatile memory may include, for example Random Access Memory (RAM), which acts as external cache memory. RAM may be provided in various forms, such as Static RAM (SRAM), Dynamic RAM (DRAM), Synchronous DRAM (SDRAM), Double Data Rate SDRAM (DDR SDRAM), Enhanced SDRAM (ESDRAM), Synchlink DRAM (SLDRAM), and Direct Rambus RAM (DRRAM). The memory 104 (e.g., data stores, databases, caches) of the subject systems and methods is intended to comprise, without being limited to, these and any other suitable types of memory.

The location module 110 is any receiver for receiving location or navigational signals from devices providing location signals. For example, the location module may be any wireless positioning device, any positioning device utilizing a radio receiver, a base station based positioning device utilizing cellular signals, a positioning device based on a Wireless Local Area Network (WLAN), etc. A radio, or wireless, receiver, includes integrated wireless receivers such as a GNSS receiver, a Wireless Fidelity (WiFi) receiver, and a Bluetooth receiver, where the receiver may include some degree of sharing of functionality between hardware and software. In accordance with an embodiment of the present invention, the location module 110 passes the extracted data to a controller 102, which processes the extracted data to determine a current location.

The location module 110 operates in any of a plurality of operational modes including a normal mode (i.e., an awake mode) and a sleep mode. During normal mode, the location module 110 receives navigational signals provided through an antenna, processes the received navigational signals, and outputs information based upon the processed navigational signals. The output information may be provided to, for example, the controller 102, but output from the location module 110 may be provided to other elements of the electronic device 100, in addition, or as an alternative, to the controller 102, in accordance with embodiments of the present invention.

When the location module 110 is operating in sleep mode, it performs only a subset or none of the operations it performs during normal mode, or may alternatively perform the same operations in a manner that reduces an amount of processing and/or power consumption of the location module 110 and/or an amount of processing and/or power consumption of the electronic device 100 overall. For example, during the sleep mode, the location module 110 may cease or reduce reception of navigational signals through the antenna, cease or reduce processing of received navigational signals, and/or cease or reduce output of information based on the processing of received navigational signals.

The location module 110 transitions from operating in normal mode to operating in sleep mode or transitions from operating in sleep mode to operating in normal mode in response to a control signal received from the controller 102 or the MEMS recorder 108. For example, when the location module 110 is operating in sleep mode, the location module 110 may receive a wake-up signal from the controller 102 or the MEMS recorder 108 instructing the location module 110 to transition from sleep mode to normal mode.

The at least one MEMS sensor 106 include (not shown) at least one sensor, such as accelerometers, digital compasses, gyroscopes, inertial modules, and other functional sensors. Any or all of the at least one MEMS sensor 106 may operate while the location module 110 is operating in the normal mode in order for the electronic device 100 to provide fusion navigation based upon a combination of information output from the location module 110 and the at least one MEMS sensor 106.

When the controller 102 and/or location module 110 is operating in sleep mode, any or all of the at least one MEMS sensor 106 may operate and output information to be used by the MEMS recorder 108 to determine whether to provide a wake-up signal to the controller 102 and/or the location module 110 instructing the controller 102 and/or location module 110 to transition from sleep mode to normal mode (i.e., awake mode).

The MEMS recorder 108 receives information output from the at least one MEMS sensor 106 either directly from the at least one MEMS sensor 106 or via the controller 102 (when the controller 102 is operating in normal mode or a sleep mode in which the controller 102 may still provide MEMS sensor information) and determines whether to output a wake-up signal based upon the received information for instructing the controller 102 and/or the location module 110 to transition from sleep mode to normal mode.

The MEMS recorder 108 filters the information output from the at least one MEMS sensor 106 such that the filtered information includes, from among the received information, only information to be utilized in determining whether to output a wake-up signal for instructing the controller 102 and/or the location module 110 to transition from sleep mode to normal mode. Filtering may also include entirely filtering out MEMS sensor information from certain MEMS sensors from among the at least one MEMS sensor 106 according to predetermined criteria.

The MEMS recorder 108 records MEMS sensor information received from the controller 102 or at least one MEMS sensor 106 and/or MEMS sensor information filtered by the MEMS recorder 108 to generate, over a period of time, MEMS sensor history information. The MEMS sensor history information may be stored in, for example, the MEMS recorder 108 and/or the memory 104.

The MEMS recorder 108 determines whether to output a wake-up signal based upon the information output from the at least one MEMS sensor 106, the filtered at least one MEMS sensor 106 information, and/or the MEMS history information. Upon determining to output the wake-up signal, the MEMS recorder 108 outputs the wake-up signal either directly to the controller 102 and/or the location module 110. The controller 102 may provide the received wake-up signal to the location module 110.

The MEMS recorder 108 determines whether to output the wake-up signal in consideration of whether a current MEMS sensor value (including, for example, a sensor value output by the at least one MEMS sensor 106 or a filtered MEMS sensor value) exceeds a predefined threshold value, or in consideration of a result of a comparison of a current at MEMS sensor value and MEMS sensor value included in the MEMS sensor history information. The threshold sensor values may include, for example, but are not limited to, thresholds for individual sensor axes (e.g., with respect to MEMS sensor value provided for a plurality of sensor axes) and thresholds for vector magnitude changes (e.g. a magnitude change with respect to current MEMS sensor value and MEMS sensor value included in the MEMS sensor history information).

In order to reduce power consumption and/or processing, any or all of the above-described operations performed by the MEMS recorder 108 may be selectively performed according to whether the controller 102 and/or the location module 110 is operating in sleep mode. The MEMS recorder 108 may receive information indicating whether the controller 102 and/or the location module 110 is operating in sleep mode from either the location module 110 or the controller 102. The controller 102 may also control the location module 110 to selectively perform any or all of the above-described operations according to whether the location module 110 is operating in sleep mode.

According to an alternative embodiment of the present invention (not shown), the MEMS recorder 108 may be included within the controller 102.

A method for recording MEMS information according to an embodiment of the present invention is described as follows with reference to FIGS. 1 and 2.

Figure 2:
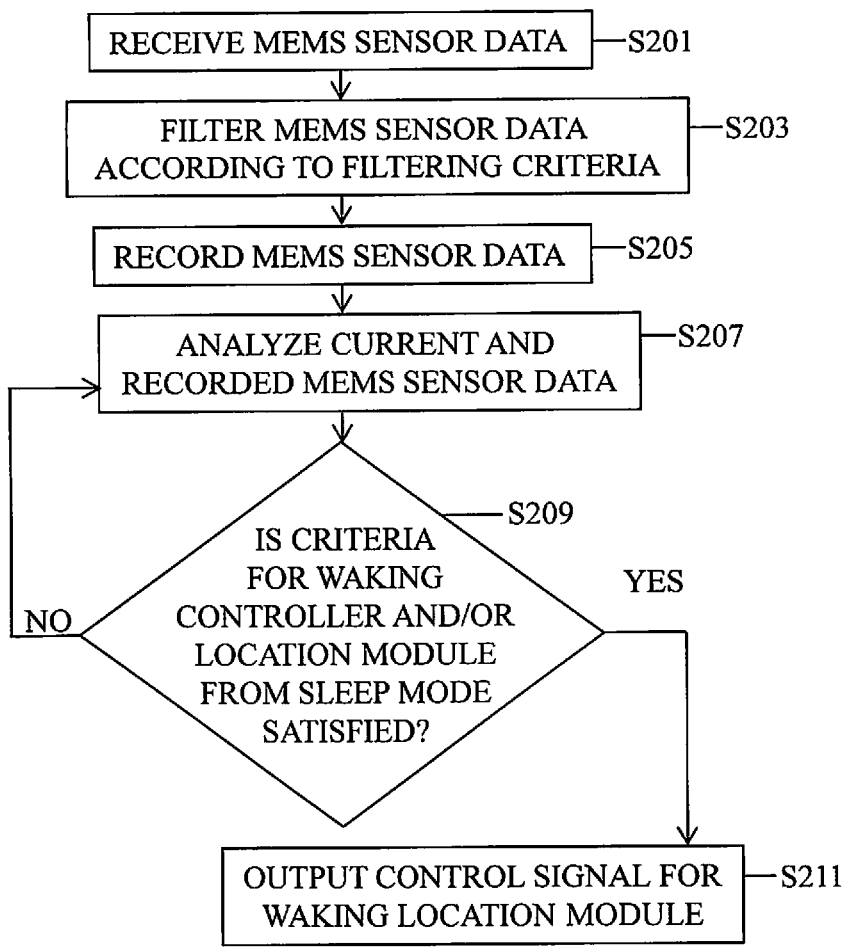
FIG. 2 is a flowchart of a method of recording MEMS information and controlling a controller and/or a location module according to an embodiment of the present invention.

FIG. 2 is a flowchart of a method of recording MEMS sensor data and controlling a controller 102 and/or location module 110 according to an embodiment of the present invention.

Referring to FIG. 2, in step S201, the MEMS recorder 108 receives MEMS sensor data sensed via at least one MEMS sensor 106. The MEMS recorder 108 receives the MEMS sensor data from, for example, the at least one MEMS sensor 106 or from the controller 102.

In step S203, the MEMS recorder 108 filters the received MEMS sensor data according to predetermined filtering criteria. The filtering criteria may include, for example, filtering the MEMS sensor data received to only the MEMS sensor data to be used in determining whether the MEMS recorder 108 outputs a signal to wake-up the controller 102 and/or the location module 110 from sleep mode.

In step S205, the MEMS recorder 108 records MEMS sensor data received from the controller 102 or at least one MEMS sensor 106 and/or MEMS sensor data filtered by the MEMS recorder 108 to generate, over a period of time, MEMS sensor history data. The MEMS sensor history data may be stored in, for example, the MEMS recorder 108 and/or the memory 104.

In step S207, the MEMS recorder analyzes MEMS sensor data including any of, or a combination of, current MEMS sensor data, filtered MEMS sensor data, MEMS sensor history data, and determines in step S209, as a result of the analysis, whether criteria for waking the controller 102 and/or the location module 110 from sleep mode is satisfied.

If the criteria for waking the controller 102 and/or the location module 110 from sleep mode are satisfied, the MEMS recorder 108 outputs a wake-up signal in step S211. Alternatively, if the criteria for waking the controller 102 and/or the location module 110 from sleep mode are not satisfied, the method returns to step S207 to continue analyzing MEMS sensor data.

According to alternative embodiments of the present invention, step S203 and/or step S205 may be omitted. For example, according to an embodiment of the present invention, the MEMS recorder 108 may record MEMS sensor data received in step S201 without filtering as described with reference to step S203. According to another embodiment of the present invention, the MEMS recorder 108 may analyze MEMS sensor data without filtering as described in step S203 (i.e., analyze unfiltered MEMS sensor data) and/or without recording MEMS sensor data in step S205 (i.e., analyze MEMS sensor data based upon current MEMS sensor data).

Figure 3A:
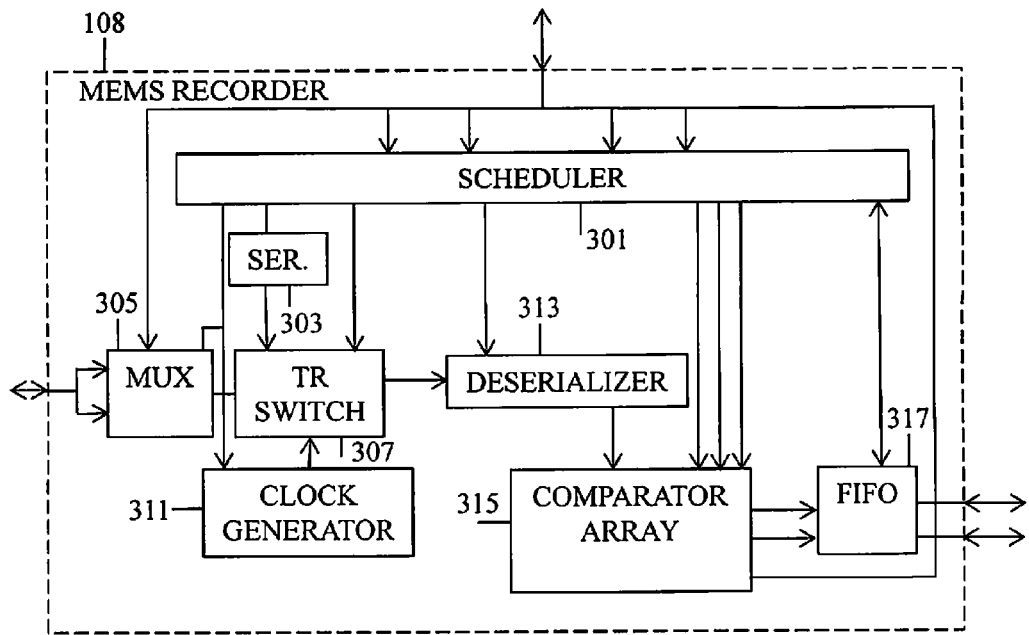
FIG. 3A is a schematic diagram of a MEMS recorder according to an embodiment of the present invention.

FIG. 3A is a schematic diagram of an embodiment of the MEMS recorder 108 of FIG. 1.

Referring to FIG. 3A, the MEMS recorder 108 may communicate via a bus. The MEMS recorder 108 may be connected to a motion sensor via an input bus that includes a bidirectional Serial Clock (SCL) input and a bidirectional Serial Data (SDA) input.

A motion sensor includes at least one MEMS sensor, such as, but not limited to, an accelerometer, a gyroscope, a magnetic sensor, and a barometer. The MEMS recorder 108 includes a multiplexer 305 to communicate with at least one sensor (e.g., a motion sensor) via an SCL signal received by the SCL input and an SDA signal received by the SDA input.

The multiplexer 305 performs communication using at least one bus, and receives a MEMS recorder enable signal (MREC_EN) from a scheduler 301 included in the MEMS recorder 108 for either commanding the MEMS recorder 108 to act as a master device, when, for example, MREC_EN is a high voltage or logic 1, or disabled (e.g. the clock signal for the MEMS recorder 108 is stopped as described below) when MREC_EN is a low voltage or logic 0. However, other values for MREC_EN may be used. The output of the multiplexer 305 is provided to a Transmit/Receive (TR) switch 307.

The TR switch 307 receives a Transmit/Receive-Bar (T_R_B) signal from the scheduler 301, and also receives serialized transmission data from a serializer 303 connected to the scheduler 301. When the T_R_B signal is a low voltage, the MEMS recorder 108 is in transmission mode. When the T_R_B signal is a high voltage, the MEMS recorder 108 is in reception mode. The serializer 303 serializes transmission data from the scheduler 301 and provides the serialized transmission data to the TR switch 307.

The TR switch 307 receives a Master Clock (M_CLK) signal from a clock generator 311. The Master Clock (M_CLK) operates the MEMS recorder 108 as a master device or disables, or stop the operation of the MEMS recorder 108, in accordance to the MREC_EN signal the clock generator 311 receives from the scheduler. In an alternate embodiment of the present invention, the counting of a Grand Repetition Period described below, operates using a real-time clock described below, to impose a sleep mode on the MEMS Recorder 108 on a user-defined period or cycle.

Based on the input from the multiplexer 305, the serializer 303, and the scheduler 301, the TR switch 307 outputs a received MEMS sensor data signal to a deserializer 313.

The deserializer 313 receives a deserializer control signal (DES_CTRL) from the scheduler 301. Based on the DES_CTRL, the deserializer 313 determines which data bits from the output signal of the TR switch 307 to provide to which comparator in a comparator array 315, where a comparator is associated with each MEMS sensor for which MEMS sensor data is received. In the present example, a motion sensor provides x-axis acceleration information, y-axis acceleration information, and z-axis acceleration information, as well as time information, and temperature information to the MEMS recorder 108 via the SDA input. The deserializer 313 separates the received output signal of the TR switch 307 into x-axis acceleration (X), y-axis acceleration (Y), z-axis acceleration (Z), time (TM), and temperature (TP) signals provided to the comparator array 315.

The scheduler 301 receives a schedule, bias values, and comparator thresholds. Each bias value indicates an error value of a sensor that changes, or biases, the output of the sensor. Based on this information, the scheduler 301 outputs the MREC_EN to the multiplexer 305 and the clock generator 311, the transmit data (TX_Data) (via the serializer 303) and the T_R_B to the TR switch 307, the DES_CTRL to the deserializer 313, a Comparator ConFiGuration (C_CFG) information signal and a Device IDentification (DID) described below to the comparator array 315, and a First-In-First-Out control (FIFO_CTRL) signal to a First-In-First-Out (FIFO) memory 317 described below.

In addition to signals (e.g., the X, Y, Z, TM, and TP signals of the present example) from the deserializer 313, the comparator array 315 receives the C_CFG information signal from the scheduler 301. The C_CFG information signal indicates, for example, how much sensor data received over time are to be combined (e.g. averaged) before being provided to the comparator array 315 and how different MEMS sensor data must be to trigger the comparator array 315 to output an Interrupt ReQuest (IRQ) to either the controller 102 or the location module 110. Thresholds may be different for different types of MEMS sensor data, and may be different for each axis of a MEMS sensor datum (e.g. each axis of acceleration). The thresholds are user-definable and may be changed as desired.

The comparator array 315 receives threshold values, bias values, and a Device IDentification (DID) from the scheduler 301, where the DID uniquely identifies the MEMS sensor from which data is received and receives MEMS sensor data from the deserializer 313. The MEMS recorder 108 receives the DID via the scheduler 301 or the SDA input to the MEMS recorder 108.

The comparator array 315 removes the bias value (i.e., subtracts or adds, depending on the sign of the error) from the associated MEMS sensor data to remove the error in the MEMS sensor data then compares one or more signals (e.g., X, Y, and Z) to one or more thresholds and provides the result of the comparison to the FIFO memory 317. Also, if the difference exceeds a threshold defined by the C_CFG, the comparator array 315 outputs an Interrupt ReQuest (IRQ) and the result of the comparison to the FIFO memory 317. The data written to the FIFO memory 317 is the actual difference between the one or more signals compared by the corresponding comparator 405, 407, 505, 507, 605, and 607 (see FIG. 5), whereas the IRQ signal is a hard decision (e.g., a high, or logic 1, voltage or a low, or logic 0, voltage) indicating that an interrupt should or should not be requested, where the value that indicates that an interrupt should be requested may be selected to be a high voltage or a low voltage.

Figure 3B:
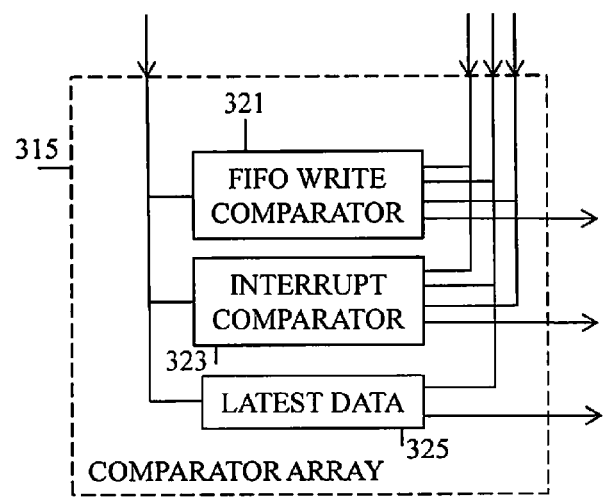
FIG. 3B is a schematic diagram of a comparator array of FIG. 3A.

FIG. 3B is a schematic diagram of the comparator array 315 of FIG. 3A.

Referring to FIG. 3A, the comparator array 315 includes a FIFO write comparator 321, an interrupt comparator 323, and a latest data register 325.

The FIFO Write comparator 321, receives MEMS sensor data from the deserializer 313 and the C_FCG signal, the DID, and the bias values from the scheduler 301. The FIFO write comparator compares the MEMS sensor data in accordance with the C_CFG to determine whether a result of the comparison should be written to the FIFO memory 317.

The interrupt comparator 323, receives MEMS sensor data from the deserializer 313 and the C_FCG signal, the DID, and the bias values from the scheduler 301. The interrupt comparator compares the MEMS sensor data in accordance with the C_CFG to determine whether an IRQ should be generated and transmitted to the FIFO memory 317.

The latest data register 325 receives data from the deserializer 313 and the DID from the scheduler 301 and provides the current MEMS sensor data (i.e., the "latest data") associated with a DID to a bus connected to the scheduler 301 so that comparisons between current MEMS sensor data and previous MEMS sensor data may be made and to generate MEMS history data that a user may query.

The FIFO memory 317 generates a Maskable IRQ (MIRQ) from the IRQ received from a interrupt comparator 323, if any, and outputs the MIRQ to a bus.

The FIFO memory 317 receives a DID and a FIFO control (FIFO_CTRL) signal from the scheduler 301 and the results of the FIFO write comparator 321 and the interrupt comparator 323. In an alternate embodiment, the FIFO memory 317 also receives a real-time clock (RTC) signal from an RTC module. The RTC module includes a Grand Repetition Period (GRP) counter that sets the frequency of measurement, or period/cycle, of the MEMS recorder 108. The RTC module is a real-time clock generator that may be external to, or included in, the MEMS recorder 108.

The FIFO memory 317 accumulates data received from the comparator array 315. Data (FIFO_DATA) stored in the FIFO memory 317 is provided to the electronic device 100 of FIG. 1. More specifically, when the FIFO memory 317 is filled and the controller 102 and/or location module 110 is not in a normal, or an awake, state, data is output to the controller 102 and/or the location module 110 to wake up the controller 102 and/or location module 110.

Figure 4:
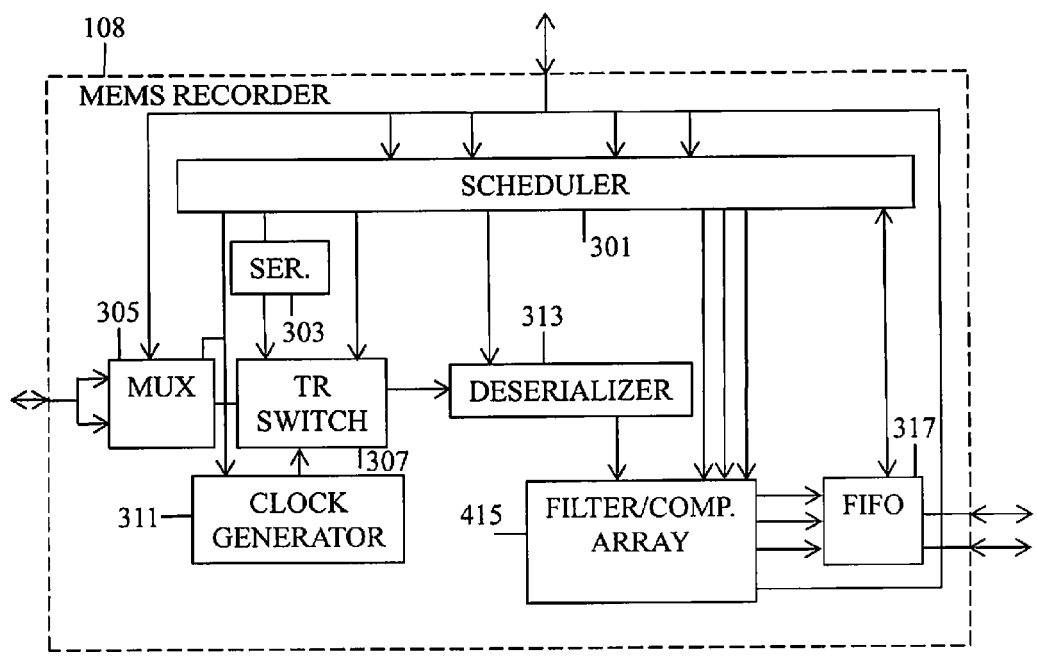
FIG. 4 is a schematic diagram of a MEMS recorder according to an embodiment of the present invention.
Figure 5:
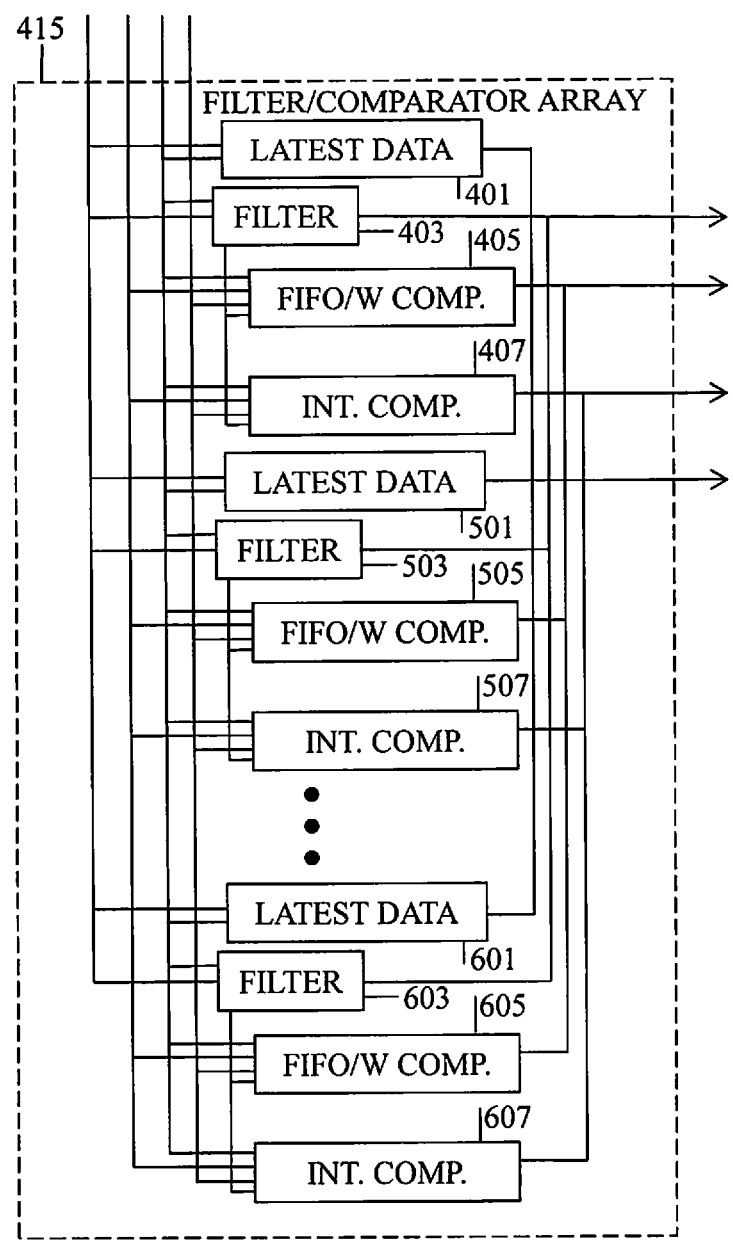
FIG. 5 is a schematic diagram of a filter/comparator of FIG. 4.

FIG. 4 is a schematic diagram of another embodiment of the MEMS recorder 108 of FIG. 1, and FIG. 5 is a schematic diagram of a filter/comparator array 415 of the MEMS recorder 108.

The components in FIG. 4 having the same reference numerals as components in FIG. 3A are like components, and their descriptions are the same as above and are not repeated below.

Based on the input from the multiplexer 305, the serializer 303, and the scheduler 301, the TR switch 307 outputs the received MEMS sensor data signal to a deserializer 413.

The deserializer 413 receives a deserializer control signal (DES_CTRL) from the scheduler 301. Based on the DES_CTRL, the deserializer 413 determines which data bits from the output signal of the TR switch 307 to provide to which filter 403, 503, and 603 and FIFO write comparator 405, 505, and 605, and interrupt comparator 407, 507, and 607 of the filter/comparator array 415. In the present example, a motion sensor provides x-axis acceleration information, y-axis acceleration information, and z-axis acceleration information, as well as time information, and temperature information to the MEMS recorder 108 via the SDA input. The deserializer 413 separates the received output signal of the TR switch 307 into x-axis acceleration (X), y-axis acceleration (Y), z-axis acceleration (Z), time (TM), and temperature (TP) signals provided to the filter/comparator array 415.

The scheduler 301 receives a schedule, filter parameters, bias values, and comparator thresholds, where each bias value represents an error associated with the output of a MEMS sensor. Based on this information, the scheduler 301 outputs the MREC_EN to the multiplexer 305 and the clock generator 311, the TX_Data (via the serializer 303) and the T_R_B to the TR switch 307, the DES_CTRL to the deserializer 413, a Filter-Comparator ConFiGuration (FC_CFG) information signal and a Device IDentification (DID) described below to the filter/comparator array 415, and a FIFO_CTRL signal to a FIFO Memory 317 described below.

In an embodiment of the present invention, the filter/comparator array 415 includes a set of a latest data section 401, 501, and 601, a filter 403, 503, and 603, a FIFO write comparator 405, 505, and 605, and an interrupt comparator 407, 507, and 607 for each MEMS sensor that provides MEMS sensor data to the MEMS recorder 108.

In addition to MEMS sensor data (e.g., the X, Y, Z, TM, and TP signals of the present example) from the deserializer 413, the filter/comparator array 415 also receives the FC_CFG information signal, the DID, and the bias values from the scheduler 301. The FC_CFG information signal indicates, for example, how much MEMS sensor data received over time are to be combined (e.g. averaged) before being provided to a FIFO write comparator 405, 505, and 605, and an interrupt comparator 407, 507, and 607 and how different current MEMS sensor data must be from previous MEMS sensor data to trigger an interrupt comparator 407, 507, and 607 to output an Interrupt Request (IRQ), via the FIFO 317, to either the controller 102 or the location module 110. Thresholds may be different for different types of MEMS sensor data, and may be different for each axis of a MEMS sensor datum (e.g. each axis of acceleration). The thresholds are user-definable and may be changed as desired.

Each latest data section 401, 501, and 601, filter 403, 503, and 603, FIFO write comparator 405, 505, and 605, and interrupt comparator 407, 507, and 607 of the filter/comparator array 415 receives a Device IDentification (DID) from the scheduler 301, where the DID uniquely identifies the MEMS sensor from which data is received. The MEMS recorder 108 receives the DID via the scheduler 301 or the SDA input. Each latest data section 401, 501, and 601 receives one or more signals (e.g., X, Y, Z, TM, and TP) from the deserializer 413, receives the DID from the scheduler 301, and outputs the latest data, which is then output from the filter/comparator array 415 and the MEMS recorder 108 via a bus. Each filter 403, 503, and 603 receives one or more signals (e.g., X, Y, and Z) from the deserializer 413 and the DID from the Scheduler 301. Each filter 403, 503, and 603 filters the received one or more signals (e.g., X, Y, and Z), and provides filtered MEMS sensor data to a corresponding FIFO write comparator 405, 505, and 605, interrupt comparator 407, 507, and 607, and a FIFO memory 317. Each filter 403, 503, and 603 may be a low-pass filter. However, a low-pass filter is not the only type of filter that may be used as a filter 403, 503, and 603. Other types of filters may be used.

Each FIFO comparator 405, 505, and 605, and interrupt comparator 407, 507, and 607 comparator removes a bias value (i.e., subtracts or adds, depending on the sign of the error) from a corresponding MEMS sensor datum. Each FIFO comparator 405, 505, and 605 compares presently filtered one or more signals (e.g., X, Y, and Z) to previously filtered one or more signals of the same type (e.g., X, Y, Z), and provides the result of the comparison to the FIFO memory 317. Also, if the difference between the currently filtered one or more signals and the previously filtered one or more signals exceeds a threshold defined by the FC_CFG, the corresponding interrupt comparator 407, 507, and 607 outputs an Interrupt ReQuest (IRQ) and the result of the comparison to the FIFO memory 317. The data written to the FIFO 317 is the actual difference between the one or more signals compared by the FIFO comparator 405, 505, and 605, whereas the IRQ 319 signal is a hard decision (e.g., a high, or logic 1, voltage or a low, or logic 0, voltage) of the interrupt comparator 407, 507, and 607 indicating that an interrupt should or should not be requested, where the value that indicates that an interrupt should be requested may be selected to be a high voltage or a low voltage.

The an IRQ section of the FIFO Memory 317 generates a Maskable IRQ (MIRQ) from the IRQ received from an interrupt comparator 407, 507, and 607 and outputs the MIRQ to a bus.

The FIFO memory 317 receives a DID and a FIFO control (FIFO_CTRL) signal from the scheduler 301 and one or more filtered signals (e.g., X, Y, and Z) from the filter 403, 503, 603. In an alternate embodiment of the present invention, the FIFO memory 317 receives a signal from a Real-Time Clock (RTC) module. The RTC module is a real-time clock generator that includes a Grand Repetition Period (GRP) counter to set the frequency of measurement of the MEMS recorder 108. The RTC module 319 may be external to, or included in, the MEMS recorder 108.

The FIFO memory 317 accumulates data received from a FIFO write comparator 405, 505, 605. Data (FIFO_DATA) stored in the FIFO memory 317 is provided to the electronic device 100 of FIG. 1. More specifically, when the FIFO memory 317 is filled and the controller 102 and/or location module 110 is not in a normal, or an awake, state, data is output to the controller 102 and/or the location module 110 to wake up the controller 102 and/or the location module 110.

Figure 6A:
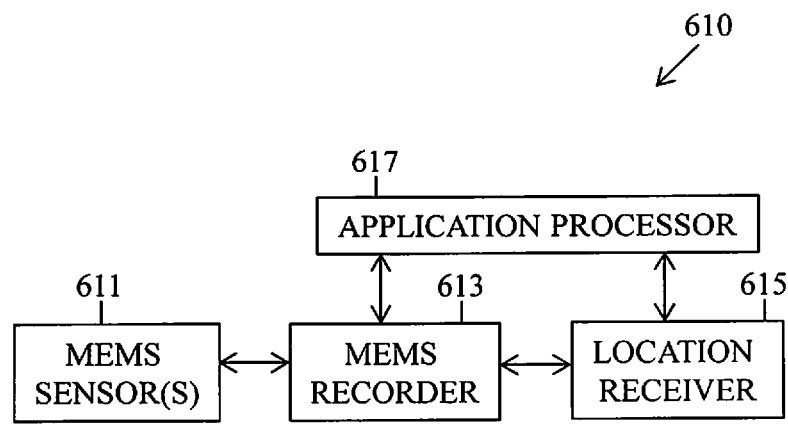
FIG. 6A is a schematic diagram of a system according to an embodiment of the present invention.

FIG. 6A is a schematic diagram of a system 610 according to an embodiment of the present invention.

Referring to FIG. 6A, the system 610 includes at least one MEMS sensor 611, a MEMS recorder 613, a location receiver 615, and an application processor 617.

The at least one MEMS sensor 611 is bi-directionally connected to the MEMS recorder 613 to provide MEMS sensor data to the MEMS recorder 613. The MEMS recorder 613 and the location receiver 615 are each bi-directionally connected to the application processor 617.

The application processor 617 enables either the MEMS recorder 613 or the location receiver 615 (e.g. a GNSS receiver) as a master device. If the location receiver 615 is the master device then the MEMS recorder 613 is disabled (e.g., a clock signal that operates the MEMS recorder 613 is stopped). After enabling a master device, the application processor 717 goes into sleep mode to conserver electrical power and is only awakened if the master device instructs it to do so (e.g., the location receiver 615, as the master device, requires information from the MEMS recorder 613 or the application processor 617 or the MEMS recorder 613, as the master device, determines from MEMS sensor data received from the at least one MEMS sensor 611 that the application processor 617 should be awakened).

If the application processor 617 is in sleep mode and the location receiver 615 is the master device, the location receiver 615 may designate the MEMS recorder 613 as the master device, and the location receiver 615 may then go into sleep mode to conserve even more electrical power.

When both the application processor 617 and the location receiver 615 are in sleep mode, the MEMS recorder 613 determines, based on MEMS sensor data received from the at least one MEMS sensors 611, whether to wake up the application processor 617 and/or the location receiver 615.

Figure 6B:
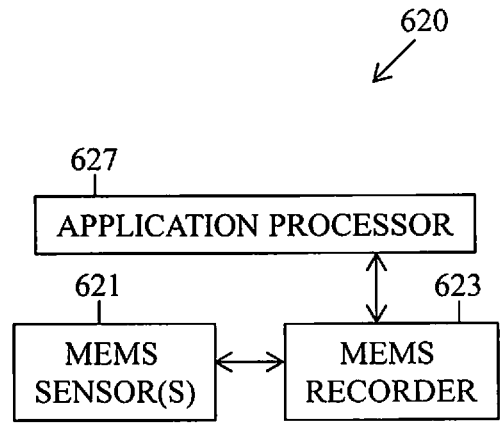
FIG. 6B is a schematic diagram of a system according to an embodiment of the present invention.

FIG. 6B is a schematic diagram of a system 620 according to an embodiment of the present invention.

Referring to FIG. 6B, the system 620 includes at least one MEMS sensor 621, a MEMS recorder 623, and an application processor 627. That is, the system 620 is the same as the system 610 of FIG. 6A, except that the location receiver 615 is not included. Otherwise, the components of the system 620 of FIG. 6B operate the same as equivalent components in FIG. 6A.

Figure 7:
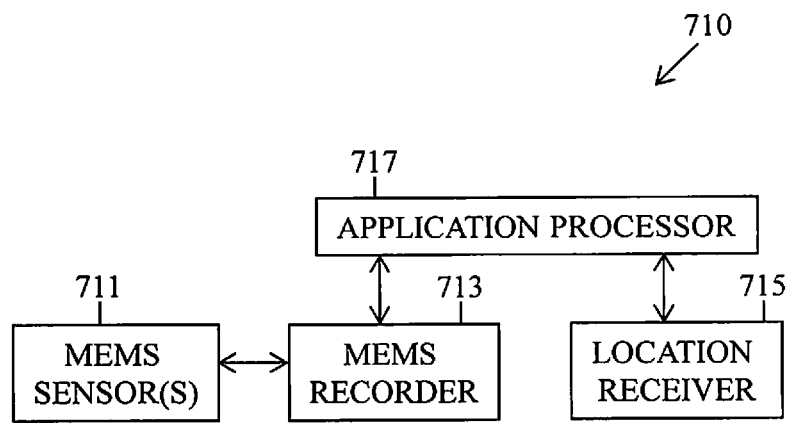
FIG. 7 is a schematic diagram of a system according to an embodiment of the present invention.

FIG. 7 is a schematic diagram of a system 710 according to an embodiment of the present invention.

Referring to FIG. 7, the system 710 includes the same components as FIG. 6A. That is, the system 710 of FIG. 7 includes at least one MEMS sensor 711, a MEMS recorder 713, a location receiver 715, and an application processor 717. The system 710 includes the same connectivity of FIG. 6A except for the bi-directional connection between the MEMS recorder 613 and the location receiver 615. Thus, the system 710 of FIG. 7 does not include the functionality of allowing the location receiver 715 to designate the MEMS recorder 713 as a master device. The application processor 717 designates the master device. Otherwise, the system 710 function similarly to the system 610 of FIG. 6A.

Figure 8:
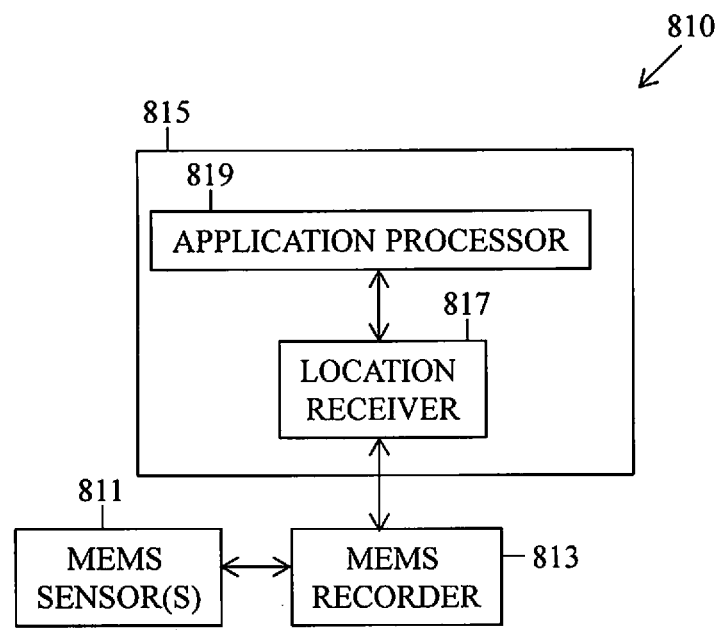
FIG. 8 is a schematic diagram of a system according to an embodiment of the present invention.

FIG. 8 is a schematic diagram of a system 810 according to an embodiment of the present invention.

Referring to FIG. 8, the system 810 includes at least one MEMS sensor 811, a MEMS recorder 813, and a combination application processor/location receiver 815.

The at least one MEMS sensor 811 is bi-directionally connected to the MEMS recorder 813 to provide MEMS sensor data to the MEMS recorder 813. The MEMS recorder 813 is bi-directionally connected to the combination application processor/location receiver 815. The combination application processor/location receiver 815 includes a location receiver 817 and an application processor 819, where similarly named components in FIGS. 6A and 8 function similarly.

The application processor 819 of FIG. 8 is bi-directionally connected to the location receiver 817, and the location receiver 817 is bi-directionally connected to the MEMS recorder 813. Thus, the system 810 operates similarly to the system 610 of FIG. 6A, except that communication between the application processor 819 and the MEMS recorder 813 must traverse the location receiver 817. To relay communication between the application processor 819 and the MEMS recorder 813, the location receiver 817 may either be in normal mode (i.e., awake) or in a semi-sleep mode that only provides electrical power to enable a relay function.

Operations described hereinabove with respect to embodiments of the present invention may be performed by one or more programmable processors executing a computer program to perform functions by operating on input data and generating output. Operations performed according to embodiments of the present invention may be implemented via hardware, software, or a combination thereof. For example, embodiments of the present invention may include software, which includes but is not limited to firmware, resident software, microcode, etc. Furthermore, embodiments of the present invention may include a computer program product accessible from a computer-usable or non-transitory computer-readable recording medium providing program code for use by or in connection with a computer or any instruction execution system. A computer-usable or non-transitory computer readable recording medium may include any apparatus that can contain, store, communicate, propagate, or transport the program for use by or in connection with the instruction execution system, apparatus, or device. Such a non-transitory computer-readable recording medium may include an electronic, magnetic, optical, electromagnetic, infrared, or semiconductor system (or apparatus or device) or a propagation medium. Examples of a non-transitory computer-readable recording medium include a semiconductor or solid state memory, magnetic tape, a removable computer diskette, a Random Access Memory (RAM), a Read-Only Memory (ROM), a rigid magnetic disk and an optical disk. Current examples of optical disks include a Compact Disk-Read Only Memory (CD-ROM), a Compact Disc-Read/Write (CD-R/W), and a Digital Versatile Disc (DVD).

While the present invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A Micro-Electromechanical System (MEMS) recorder, comprising:

a scheduler configured to receive a recording schedule, bias values, comparator thresholds, and a device identification for at least one MEMS sensor;

a serializer configured to serialize data received from the scheduler;

a multiplexer configured to receive MEMS sensor data from at least one MEMS sensor, receive MEMS sensor data from another device, and receive an enable signal from the scheduler;

a transmit/receive switch configured to receive MEMS sensor data from the multiplexer, receive serialized data from the serializer, and receive a signal from the scheduler indicating whether to receive or transmit;

a master clock generator configured to generate a master clock signal for the MEMS recorder;

a deserializer configured to receive a deserialize control signal from the scheduler, receive serialized MEMS sensor data from the transmit/receive switch, and deserialize the received serialized MEMS sensor data;

a comparator array configured to receive a compare control signal from the scheduler, receive the bias values, receive deserialized MEMS sensor data from the deserializer, store the received deserialized MEMS sensor data as latest data, receive the device identification associated with the received deserialized MEMS sensor data, remove the bias values from the corresponding MEMS sensor data, compare the deserialized MEMS sensor data to the comparator threshold in accordance with the compare control signal to determine whether to generate a signal to wake up a controller and/or a location module if the controller and/or the location module are in sleep mode; and a First-In-First-Out (FIFO) memory configured to receive a FIFO control signal from the scheduler, receive the latest data from the comparator array, receive the result of the comparison from the comparator array, receive the signal to wake up the controller and/or the location module, if any, from the comparator array, and output data to be stored and wake up the controller and/or the location module, if the signal indicates that the controller and/or the location module should be awakened or the FIFO memory is full, wherein the controller and/or the location module is awakened directly by the MEMS recorder or via the controller.

2. The MEMS recorder of claim 1, wherein the multiplexer is a multiplexer configured to receive MEMS sensor data from at least one MEMS sensor via a serial clock input/output and a serial data input/output, receive MEMS sensor data from another device, and receive an enable signal from the scheduler.

3. The MEMS recorder of claim 1, wherein the at least one MEMS sensor comprises an accelerometer, a digital compass, a gyroscope, an inertial module, a magnetic sensor, and a barometer.

4. The MEMS recorder of claim 1, wherein comparator thresholds differ for different MEMS sensors or different axes of MEMS sensor data, and where the comparator thresholds may be used employed individually or as a vector.

5. The MEMS recorder of claim 1, wherein the location module is comprised of one of a wireless positioning device, a positioning device utilizing a radio receiver, a base station based positioning device utilizing cellular signals, a positioning device based on a Wireless Local Area Network (WLAN), wherein the wireless receiver comprises a Global Navigation Satellite System (GNSS) receiver, a Wireless Fidelity (WiFi) receiver, and a Bluetooth receiver, and wherein the wireless receiver may include a user-defined degree of sharing of functionality between hardware and software.

6. The MEMS recorder of claim 1, wherein the comparator array comprises a number of array elements equal to a number of MEMS sensors providing MEMS sensor data, wherein each of the number of array elements includes:
a latest data module configured to store and output MEMS sensor data received that was most recently received;
a FIFO comparator configured to remove bias values from MEMS sensor data and compare MEMS sensor data most recently received to MEMS sensor data previously received to determine if the comparison result should be stored in the FIFO memory; and
an interrupt comparator configured to remove bias values from MEMS sensor data and compare MEMS sensor data most recently received to MEMS sensor data previously received to determine if an interrupt signal should be generated.

7. A Micro-Electromechanical System (MEMS) recorder, comprising:
a scheduler configured to receive a recording schedule, filter parameters, bias values, comparator thresholds, and a device identification for at least one MEMS sensor;
a serializer configured to serialize data received from the scheduler;
a multiplexer configured to receive MEMS sensor data from at least one MEMS sensor, receive MEMS sensor data from another device, and receive an enable signal from the scheduler;
a transmit/receive switch configured to receive MEMS sensor data from the multiplexer, receive serialized data from the serializer, and receive a signal from the scheduler indicating whether to receive or transmit;
a master clock generator configured to generate a master clock signal for the MEMS recorder;
a deserializer configured to receive a deserialize control signal from the scheduler, receive serialized MEMS sensor data from the transmit/receive switch, and deserialize the received serialized MEMS sensor data;
a filter/comparator array configured to receive a filter/compare control signal from the scheduler, receive the bias values, receive deserialized MEMS sensor data from the deserializer, store the received deserialized MEMS sensor data as latest data, receive the device identification associated with the received deserialized MEMS sensor data, filter the received deserialized MEMS sensor data according to the filter/compare control signal, remove the bias values from the corresponding MEMS sensor data, compare the result of filtering to previous results of filtering to determine whether to generate a signal to wake up a controller and/or a location module if the controller and/or the location module are in sleep mode; and
a First-In-First-Out (FIFO) memory configured to receive a FIFO control signal from the scheduler, receive the latest data from the filter/comparator array, receive the filtered MEMS sensor data from the filter/comparator array, receive the result of the comparison from the filter/comparator array, receive the signal to wake up the controller and/or the location module, if any, from the filter/comparator array, and output data to be stored and wake up the controller and/or the location module, if the signal indicates that the controller and/or the location module should be awakened or the FIFO memory is full, wherein the controller and/or the location module is awakened directly by the MEMS recorder or via the controller.

8. The MEMS recorder of claim 7, wherein the multiplexer is a multiplexer configured to receive MEMS sensor data from at least one MEMS sensor via a serial clock input/output and a serial data input/output, receive MEMS sensor data from another device, and receive an enable signal from the scheduler.

9. The MEMS recorder of claim 7, wherein the at least one MEMS sensor comprises an accelerometer, a digital compass, a gyroscope, an inertial module, a magnetic sensor, and a barometer.

10. The MEMS recorder of claim 7, wherein the filter/compare control signal indicates an amount of MEMS sensor data to average before comparing.

11. The MEMS recorder of claim 7, wherein comparator thresholds differ for different MEMS sensors or different axes of MEMS sensor data, and where the comparator thresholds may be used employed individually or as a vector.

12. The MEMS recorder of claim 7, wherein the location module is comprised of one of a wireless positioning device, a positioning device utilizing a radio receiver, a base station based positioning device utilizing cellular signals, a positioning device based on a Wireless Local Area Network (WLAN), wherein the wireless receiver comprises a Global Navigation Satellite System (GNSS) receiver, a Wireless Fidelity (WiFi) receiver, and a Bluetooth receiver, and wherein the wireless receiver may include a user-defined degree of sharing of functionality between hardware and software.

13. The MEMS recorder of claim 7, wherein the filter/comparator array comprises a number of array elements equal to a number of MEMS sensors providing MEMS sensor data, wherein each of the number of array elements includes:
a latest data module configured to store and output MEMS sensor data received that was most recently received;
a filter module is configured to filter MEMS sensor data in accordance with the filter/compare control signal;
a FIFO comparator configured to remove bias values from MEMS sensor data and compare MEMS sensor data most recently received to MEMS sensor data previously received to determine if the comparison result should be stored in the FIFO memory; and an interrupt comparator configured to remove bias values from MEMS sensor data and compare MEMS sensor data most recently received to MEMS sensor data previously received to determine if an interrupt signal should be generated.

14. A method of recording Micro-Electromechanical System (MEMS) sensor data, comprising:

receiving, via a scheduler, a recording schedule, filter parameters, bias values, comparator thresholds, and a device identification for at least one MEMS sensor;

serializing, via a serializer, data received from the scheduler;

receiving, via a multiplexer, MEMS sensor data from at least one MEMS sensor, MEMS sensor data from another device, and an enable signal from the scheduler;

receiving, via a transmit/receive switch, MEMS sensor data from the multiplexer, serialized data from the serializer, and a signal from the scheduler indicating whether to receive or transmit;

generating, via a master clock generator, a master clock signal;

receiving, via a deserializer, a deserialize control signal from the scheduler, serialized MEMS sensor data from the transmit/receive switch, and deserializing the received serialized MEMS sensor data;

receiving, via a filter/comparator array, a filter/compare control signal from the scheduler, bias values from the scheduler, deserialized MEMS sensor data from the deserializer, and storing the received deserialized MEMS sensor data as latest data, receiving the device identification associated with the received deserialized MEMS sensor data, filtering the received deserialized MEMS sensor data according to the filter/compare control signal, removing the bias values from the corresponding MEMS sensor data, comparing the result of filtering to previous results of filtering to determine whether to generate a signal to wake up a controller and/or a location module if the controller and/or the location module is in sleep mode; and receiving, via a First-In-First-Out (FIFO) memory, a FIFO control signal from the scheduler, the latest data from the filter/comparator array, the filtered MEMS sensor data from the filter/comparator array, the result of the comparison from the filter/comparator array, the signal to wake up the controller and/or the location module, if any, from the filter/comparator array, and outputting data to be stored and waking up the controller and/or the location module, if the signal indicates that the controller and/or the location module should be awakened or the FIFO memory is full, wherein the controller and/or the location module is awakened directly by the MEMS recorder or via the controller.

15. The method of claim 14, wherein receiving, via a multiplexer, MEMS sensor data from at least one MEMS sensor via a serial clock input/output and a serial data input/output, MEMS sensor data from another device, and an enable signal from the scheduler comprises receiving, via a multiplexer, MEMS sensor data from at least one MEMS sensor, MEMS sensor data from another device, and an enable signal from the scheduler.

16. The method of claim 14, wherein the at least one MEMS sensor comprises an accelerometer, a digital compass, a gyroscope, an inertial module, a magnetic sensor, and a barometer.

17. The method of claim 14, wherein the filter/compare control signal indicates an amount of MEMS sensor data to average before comparing.

18. The method of claim 14, wherein comparator thresholds differ for different MEMS sensors or different axes of MEMS sensor data, and where the comparator thresholds may be used employed individually or as a vector.

19. The method of claim 14, wherein the location module is comprised of one of a wireless positioning device, a positioning device utilizing a radio receiver, a base station based positioning device utilizing cellular signals, a positioning device based on a Wireless Local Area Network (WLAN), wherein the wireless receiver comprises a Global Navigation Satellite System (GNSS) receiver, a Wireless Fidelity (WiFi) receiver, and a Bluetooth receiver, and wherein the wireless receiver may include a user-defined degree of sharing of functionality between hardware and software.

20. The MEMS recorder of claim 14, wherein the filter/comparator array comprises a number of array elements equal to a number of MEMS sensors providing MEMS sensor data, wherein each of the number of array elements includes:

a latest data module configured to store and output MEMS sensor data received that was most recently received;

a filter module is configured to filter MEMS sensor data in accordance with the filter/compare control signal;

a FIFO comparator configured to remove bias values from MEMS sensor data and compare MEMS sensor data most recently received to MEMS sensor data previously received to determine if the comparison result should be stored in the FIFO memory; and an interrupt comparator configured to remove bias values from MEMS sensor data and compare MEMS sensor data most recently received to MEMS sensor data previously received to determine if an interrupt signal should be generated.

* * * * *